United States Patent
Douglas et al.

[11] Patent Number: 5,868,856
[45] Date of Patent: Feb. 9, 1999

[54] METHOD FOR REMOVING INORGANIC CONTAMINATION BY CHEMICAL DERIVITIZATION AND EXTRACTION

[75] Inventors: Monte A. Douglas, Coppell; Allen C. Templeton, Princeton, both of Tex.

[73] Assignee: Texas Instruments Incorporated, Dallas, Tex.

[21] Appl. No.: 898,936

[22] Filed: Jul. 23, 1997

Related U.S. Application Data

[60] Provisional application No. 60/022,811 Jul. 25, 1996.

[51] Int. Cl.⁶ .................................................. B08B 3/00
[52] U.S. Cl. ............................. 134/2; 134/1; 134/1.3; 134/3; 134/26; 134/28; 134/29; 134/36; 134/31; 134/21; 134/902; 436/745; 436/753; 436/756; 436/749; 436/902
[58] Field of Search ............................. 134/1, 2, 1.3, 3, 134/26, 28, 29, 36, 21, 31, 902; 438/745, 753, 756, 902, 749

[56] References Cited

U.S. PATENT DOCUMENTS

| | | | |
|---|---|---|---|
| 4,749,440 | 6/1988 | Blackwood et al. | 156/646 |
| 4,923,828 | 5/1990 | Gluck et al. | 437/225 |
| 5,261,965 | 11/1993 | Moslehi | 134/1 |
| 5,290,361 | 3/1994 | Hayegshida et al. | 134/2 |
| 5,316,591 | 5/1994 | Chao et al. | 134/34 |
| 5,356,538 | 10/1994 | Wai et al. | 210/634 |
| 5,377,705 | 1/1995 | Smith, Jr. et al. | 134/10 |
| 5,470,393 | 11/1995 | Fukazawa | 134/3 |
| 5,494,526 | 2/1996 | Peranjpe | 134/1 |
| 5,501,761 | 3/1996 | Evans et al. | 156/344 |
| 5,522,938 | 6/1996 | O'Brien | 134/1 |
| 5,550,211 | 8/1996 | DeCrosta et al. | 528/480 |
| 5,580,846 | 12/1996 | Hayashida et al. | 510/175 |
| 5,635,463 | 6/1997 | Muraoka | 510/175 |
| 5,637,151 | 6/1997 | Schulz | 134/2 |
| 5,656,097 | 8/1997 | Olesen et al. | 134/1 |
| 5,679,169 | 10/1997 | Gonzaleo et al. | 134/1.3 |
| 5,679,171 | 10/1997 | Saga et al. | 134/3 |

*Primary Examiner*—Jill Warden
*Assistant Examiner*—S. Carrillo
*Attorney, Agent, or Firm*—Mark A. Valetti; Carl H. Hoel; Richard L. Donaldson

[57] ABSTRACT

A method of removing inorganic contamination from substantially the surface of a semiconductor substrate, the method comprising the steps of: reacting the inorganic contamination with at least one conversion agent, thereby converting the inorganic contamination; removing the converted inorganic contamination by subjecting it to at least one solvent agent, the solvent agent is included in a first supercritical fluid (preferably supercritical $CO_2$); and wherein the converted inorganic contamination is more highly soluble in the solvent agent than the inorganic contamination.

11 Claims, 1 Drawing Sheet

METHOD FOR REMOVING INORGANIC CONTAMINATION BY CHEMICAL DERIVITIZATION AND EXTRACTION

This application claims priority under 35 USC § 119(e)(1) of provisional application number 60/022,811, filed Jul. 25, 1996.

CROSS-REFERENCE TO RELATED PATENT/PATENT APPLICATIONS

The following commonly assigned patent/patent applications are hereby incorporated herein by reference:

| Patent No./Serial No. | Filing Date | TI Case No. |
|---|---|---|
| 08/903,907 | 8/01/1996 | TI-21232 |

FIELD OF THE INVENTION

The instant invention pertains to semiconductor device fabrication and processing and more specifically to the removal of inorganic contamination at the surface of a semiconductor structure.

BACKGROUND OF THE INVENTION

In the manufacture of, for example, integrated circuits and liquid crystal displays, contamination of the substrate and subsequent semiconductor layers causes many problems and should be reduced as much as possible. Examples of such contamination are residual particulates, organics, and metals. In addition, contaminants may be situated on the surface of the semiconductor layer, or they may be situated between the semiconductor layer and another layer (e.g. an oxide layer). Typically, wet-processing is utilized in the fabrication of semiconductor devices. A wet cleaning process may consist of a sequence of particle removal and metal removal steps, with a rinsing step performed between them, and concluding with a drying step. Drying is typically accomplished either by spinning the wafer so that the liquid on the wafer will be spun off or by raising the wafers from a cloud of hot isopropyl alcohol vapor which condenses on the surface of the wafer and displaces the water.

This type of wet cleaning process suffers from a particularly serious drawback, specifically, most metal removal processes of this type (typically consisting of strongly acidic mixtures) add particles to the surface of the wafer, and particle removal processes (typically comprised of basic/oxidant mixtures) add metals to the surface of the wafer. In addition, most wet cleaning processes suffer from the problems of: expense of obtaining electronic-grade wet chemicals; expense of disposing of the caustic chemicals which are used in wet cleaning processes; liquid surface tension limiting or preventing access of wet chemical cleaning to high aspect ratio features, like trenches; and lack of harmonization with all dry processing (which is utilized more frequently in semiconductor processing). Hence, a metal removal step followed by a particle removal step will result in residual metals, while the reverse process results in fewer particles but can become contaminated with metals by the final rinsing.

Supercritical fluids (namely, supercritical carbon dioxide) have received much attention, lately. This is especially true in the area's involving decaffeination of coffee and linen/fine clothing dry cleaning. In addition, supercritical $CO_2$ can be used in the removal of organic contaminates from semiconductor wafers. See *International Journal of Environmentally Conscious Design & Manufacturing*, Vol. 2, p. 83 (1993) (stating "[s]upercritical carbon dioxide is best applied to the removal of organic compounds with mid-to-low volatilities"). However, supercritical $CO_2$ is generally regarded as ineffective in cleaning inorganic contaminants (namely, metals) from semiconductor wafers.

Relating to another field, a group of researchers have discovered a way of removing metals from vegetation by subjecting the vegetation to supercritical $CO_2$ and neutralizing the metals with chelating agents. See Elizabeth K. Wilson, *Toxic Metals Extracted with Supercritical Carbon Dioxide*, C&EN 27 (Apr. 15, 1996); and U.S. Pat. No. 5,356,538. However, this work states that "[b]y itself, nonpolar supercritical $CO_2$ is almost useless for solvating positively charged heavy-metal ions. However, researchers have discovered that metals can be solvated if they are first neutralized by chelating agents and, furthermore, that the solvency increases dramatically when the chelating agents are fluorinated." Id. at 27. However, there are several problems with this approach. First, there is a difficulty removing uncharged metals. Second, unfluorinated chelating agents are expensive. Third, mass scale synthesis of fluorinated chelating agents is expensive. Fourth, fluorinated and unfluorinated chelating agents are highly toxic and expensive to purify and dispose of. Fifth, there is a limited range of metals that can be readily solvated by the fluorinated chelating agents. Sixth, diffusion of unchelated metals into an underlying semiconductor substrate would be disastrous using the methodology of this publication.

It is, therefore, an object of the instant invention to provide a method of removing metal contaminants from semiconductor wafers. It is another object of the instant invention to provide a method of removing inorganic contaminants from semiconductor wafers.

SUMMARY OF THE INVENTION

In summary, one embodiment of the instant invention is a method which overcomes the problems involved with chemical modification of the ionic and neutral, light and heavy inorganic (metal) species and which renders these ionic and neutral, light and heavy inorganic (metal) species soluble upon exposure to conventional, inexpensive, high purity, nontoxic solvents. The method of the instant invention includes the steps of chemically altering the metal (inorganic) contaminants on the surface of the native oxide (which overlies the semiconductor substrate). This is preferably accomplished using a very broad spectrum of modification agents/chemicals, and the metal alteration may occur before or during exposure to a supercritical fluid (preferably $CO_2$). Next, the chemically-altered metal is exposed to a conventional solvent incorporated within a supercritical $CO_2$ fluid. Finally, the conventionally-solvated, chemically-altered metal is removed in the supercritical $CO_2$ medium. Key aspects of this invention are that the inorganic contaminant is not soluble in the supercritical $CO_2$ fluid without prior chemical alteration, and the chemically-altered inorganic contaminant may be removed by the solvent simultaneously with the chemical alteration step.

An embodiment of the instant invention is a method of removing inorganic contamination from substantially the surface of a semiconductor substrate, the method comprising the steps of: reacting the inorganic contamination with at least one conversion agent, thereby converting the inorganic contamination; removing the converted inorganic contamination by subjecting it to at least one solvent agent, the solvent agent is included in a first supercritical fluid (preferably supercritical $CO_2$); and wherein the converted inorganic contamination is more highly soluble in the solvent agent than the inorganic contamination. Preferably, the conversion agent is selected from the group consisting of: an acid agent, a basic agent, a chelating agent, a ligand agent, a halogen-containing agent, and any combination thereof. Preferably, the inorganic contamination is situated on substantially the surface of a native oxide which overlies the substrate, and it may consist of metal contamination. The conversion agent may be included in a second supercritical fluid, which is preferably supercritical $CO_2$. The steps of reacting the inorganic contamination with at least one conversion agent and removing the converted inorganic contamination by subjecting it to at least one solvent agent may be performed simultaneously or sequentially. Preferably, the solvent agent is selected from the group consisting of: a polar gas, a nonpolar gas, a polar supercritical fluid, a nonpolar supercritical fluid, a polar species, a nonpolar species, a surfactants, a detergent, a amphoteric material, or a chelating agent.

Another embodiment of the instant invention is a method of removing metallic contamination from substantially the surface of a semiconductor substrate, the method comprising the steps of: reacting the metallic contamination with at least one conversion agent thereby converting the metallic contamination, the conversion agent is included in a first supercritical $CO_2$ fluid; removing the converted metallic contamination by subjecting it to at least one solvent agent, the solvent agent is included in a second supercritical $CO_2$ fluid; and wherein the converted metallic contamination is more highly soluble in the solvent agent than the metallic contamination. The steps of reacting the metallic contamination with at least one conversion agent and removing the converted metallic contamination by subjecting it to at least one solvent agent may be performed simultaneously or sequentially.

DETAILED DESCRIPTION OF THE INSTANT INVENTION

Figure 1:
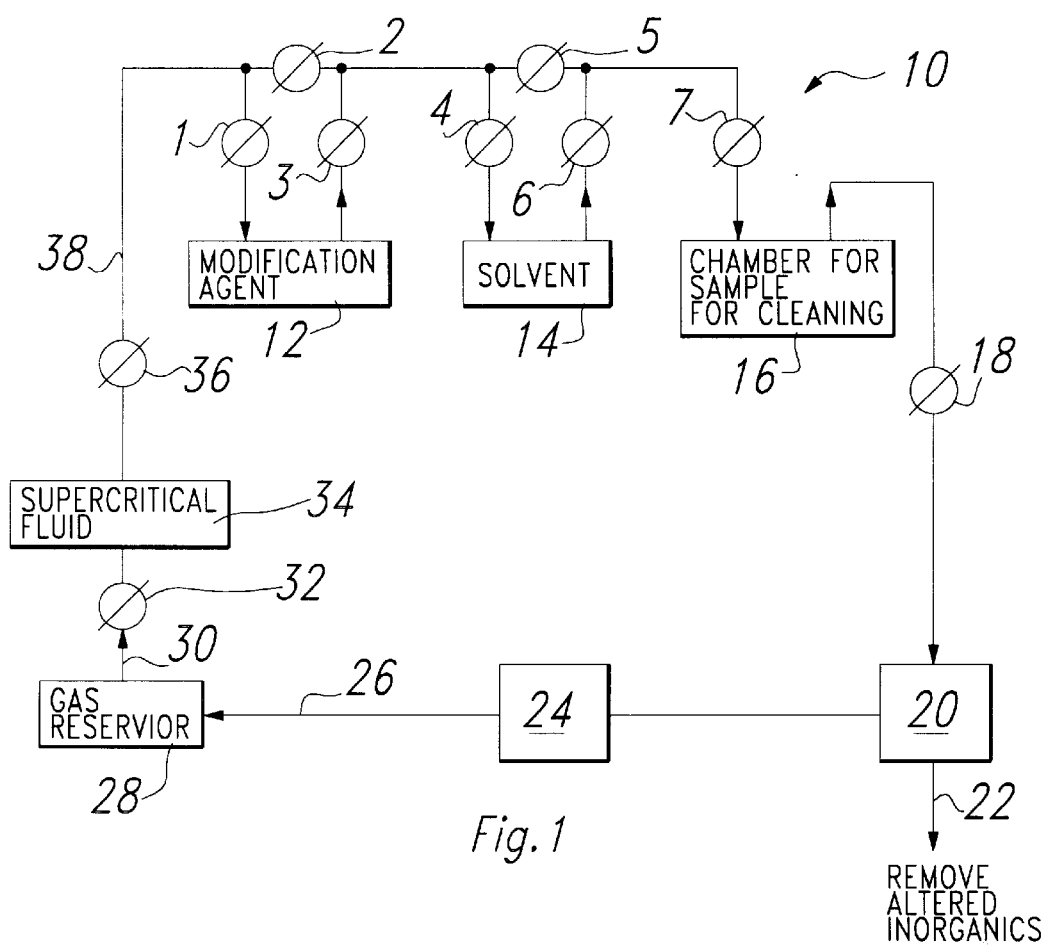
FIG. 1 is a schematic drawing of a sample cleaning system in accordance with an embodiment of the instant invention.

FIG. 1 illustrates a process system which can be utilized to implement the method of the instant invention. The sample to be cleaned (the semiconductor wafer with inorganic contamination present) is held in container 16. A supercritical fluid (preferably a $CO_2$ gas) is supplied from a gas reservoir 28 which is connected by a conduit 30, which includes valve 32, to a pressurization unit 34 that increases the pressure on the gas to greater than approximately 70 to 75 atmospheres at a temperature greater than approximately 32° C. to form the supercritical fluid. The supercritical fluid (SCF) travels through valve 36 and conduit 38 to a reservoir 12 (as long as valves 1 and 3 are open and valve 2 is closed) that holds a solid, liquid, or gas modification agent(s). Possible modification agents are listed below. The passing of the SCF through the modification agent acts to incorporate the modification agent into the SCF. The SCF incorporated with the modification agent leave reservoir 12 and enters container 16. The SCF mixture and inorganic contamination are introduced, resulting in the modification of the inorganic contamination.

Subsequent to or simultaneous with modification of the inorganic contamination on the semiconductor sample by the modification agent, the SCF travels through valve 36 and conduit 38 to reservoir 14 which holds a solid, liquid, or gaseous solvent agent(s). This is accomplished by closing valves 1, 3, and 5 and opening valves 2, 4, and 6. The passing of the SCF through the solvent agent acts to incorporate the solvent agent into the SCF. The SCF incorporated with the solvent agent leaves reservoir 14 and enters chamber 16. The SCF mixture and modified inorganic contamination are introduced, thereby resulting in the removal of the modified inorganic contamination from the surface of the sample (preferably a semiconductor wafer).

The modified inorganic contaminant and the $CO_2$ are removed and passed through depressurization valve 18 such that the inorganic contaminant precipitates in container 20. The $CO_2$ gas is then recycled by pump 24 through line 26 to reservoir 28. The inorganic contaminants can be removed via line 22.

One embodiment of the instant invention is a method of removing inorganic contamination (preferably metals) from the top monolayer of a conductive, semiconductive, or insulating layer. The "top monolayer" generally refers to the top 5 Å of the layer, and the layer is generally comprised of an oxide (probably a native oxide layer).

In general, this embodiment of the instant invention is a method to remove inorganic contamination, including metals, from substrate surfaces or the surface of a native oxide, grown on the substrate, by chemical conversion of the inorganic material to a different material that has higher solubility in a solvent for subsequent removal by the solvent in a supercritical fluid (preferably supercritical $CO_2$). More specifically, the method of this embodiment would preferably comprise the steps of: reacting the inorganic contamination with a conversion agent; and removing the converted inorganic contamination product with a solvent (which is preferably completely or partially contained within a supercritical fluid, such as $CO_2$). The conversion agent may be an acid (preferably KCN, HF, HCl, or KI), a base (preferably $NH_4OH$, KOH, or $NF_3$), a chelating and/or ligand agent (preferably dibetaketone), or a halogen-containing agent (preferably CO, $NH_3$, NO, COS, $NH_4OH$, water, or $H_2O_2$). The conversion agent may be introduced to the semiconductor wafer by vapor exposure, plasma exposure, or incorporating the conversion agent in a supercritical fluid (preferably $CO_2$) and exposing the wafer to this combination. The solvent may be comprised of a polar gas (preferably CO, COS, NO, $NH_3$, or $NF_3$), nonpolar gases (preferably $N_2$, $H_2$, $O_2$, or $F_2$), polar SCF (preferably $NO_2$), nonpolar SCF (preferably $CO_2$), a polar species (preferably water, ethanol, methanol, acetone, or glycol), a nonpolar species (preferably tetrahydrofuan, or dimethylformamide), surfactants, detergents, or amphoteric materials (preferably sodium dodecyl sulfate, quaternary ammonium salts, or cationic, anionic, nonionic or zwitterionic surfactants), or a chelating agent (preferably beta-diketone, fluorinated or unfluorinated crown ether).

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of substantially removing inorganic contamination from a surface of a semiconductor substrate, said method comprising the steps of:

reacting said inorganic contamination having a first solubility in at least one solvent agent with at least one conversion agent, to convert said inorganic contamination into a converted inorganic contamination which has a second solubility in said at least one solvent agent;

removing said converted inorganic contamination having said second solubility in said at least one solvent agent by subjecting it to said at least one solvent agent, said solvent agent being included in a first supercritical fluid;

and wherein said second solubility in said at least one solvent agent is greater than said first solubility in said at least one solvent agent.

2. The method of claim 1, wherein said conversion agent is selected from the group consisting of: an acid agent, a basic agent, a chelating agent, a ligand agent, a halogen-containing agent, and any combination thereof.

3. The method of claim 1, wherein said first supercritical fluid is supercritical $CO_2$.

4. The method of claim 1, wherein said inorganic contamination is situated on substantially the surface of a native oxide which overlies said substrate.

5. The method of claim 1, wherein said conversion agent is included in a second supercritical fluid.

6. The method of claim 1, wherein said second supercritical fluid is supercritical $CO_2$.

7. The method of claim 1, wherein said steps of reacting said inorganic contamination with said at least one conversion agent and removing said converted inorganic contamination by subjecting it to said at least one solvent agent are performed simultaneously.

8. The method of claim 1, wherein said solvent agent is selected from the group consisting of: a polar gas, a nonpolar gas, a polar supercritical fluid, a nonpolar supercritical fluid, a polar species, a nonpolar species, a surfactant, a detergent, a amphoteric material, and a chelating agent.

9. The method of claim 1, wherein said inorganic contamination is metal contamination.

10. A method of substantially removing metallic contamination from a surface of a semiconductor substrate, said method comprising the steps of:

reacting said metallic contamination having a first solubility in at least one solvent agent with at least one conversion agent to convert said metallic contamination into a converted metallic contamination which has a second solubility in said at least one solvent agent, said conversion agent being included in a first supercritical $CO_2$ fluid;

removing said converted metallic contamination having said second solubility in said at least one solvent agent by subjecting it to said at least one solvent agent, said solvent agent being included in a second supercritical $CO_2$ fluid;

and wherein said second solubility is greater than said first solubility in said at least one solvent agent.

11. The method of claim 10, wherein said steps of reacting said metallic contamination with said at least one conversion agent and removing said converted metallic contamination by subjecting it to said at least one solvent agent are performed simultaneously.

* * * * *